US005766360A

United States Patent [19]
Sato et al.

[11] Patent Number: 5,766,360
[45] Date of Patent: Jun. 16, 1998

[54] SUBSTRATE PROCESSING APPARATUS AND SUBSTRATE PROCESSING METHOD

[75] Inventors: Yuusuke Sato; Toshimitsu Ohmine. both of Tokyo-To; Takaaki Honda. Mishima, all of Japan

[73] Assignees: Kabushiki Kaisha Toshiba. Kawasaki; Toshiba Kikai Kabushiki Kaisha. Tokyo-To, both of Japan

[21] Appl. No.: 36,894

[22] Filed: Mar. 25, 1993

[30] Foreign Application Priority Data

| Mar. 27, 1992 | [JP] | Japan | 4-071331 |
| Mar. 27, 1992 | [JP] | Japan | 4-071439 |
| Mar. 27, 1992 | [JP] | Japan | 4-071440 |
| Mar. 27, 1992 | [JP] | Japan | 4-071692 |

[51] Int. Cl.$^6$ ........................................ C23C 16/00
[52] U.S. Cl. ................. 118/666; 118/708; 118/712; 118/715; 118/719; 204/298.25; 156/345; 427/9; 427/10
[58] Field of Search ................. 118/715, 719, 118/708, 712, 666; 204/298.25; 156/626.1, 626.2, 345; 427/8, 9, 10; 437/8

[56] References Cited

U.S. PATENT DOCUMENTS

| 4,181,544 | 1/1980 | Cho | 148/175 |
| 4,388,034 | 6/1983 | Takahashi | 414/331 |
| 4,498,416 | 2/1985 | Bouchaib | 118/719 |
| 4,592,306 | 6/1986 | Gallego | 118/719 |
| 4,642,243 | 2/1987 | Yamazaki | 427/38 |
| 4,670,126 | 6/1987 | Messer | 204/298.25 |
| 4,824,545 | 4/1989 | Arnold et al. | 204/298 |
| 5,024,570 | 6/1991 | Kiriseko | 414/222 |
| 5,240,552 | 8/1993 | Yu | 156/626.1 |
| 5,271,796 | 12/1993 | Miyashita | 156/626.1 |
| 5,310,410 | 5/1994 | Begin | 118/719 |

FOREIGN PATENT DOCUMENTS

| 0 497 066 | 8/1982 | European Pat. Off. |
| 0 410 504 | 1/1991 | European Pat. Off. |
| 0 430 079 | 6/1991 | European Pat. Off. |
| 84/02403 | 6/1984 | WIPO |
| 87/00084 | 1/1987 | WIPO |
| 87/07309 | 12/1987 | WIPO |

OTHER PUBLICATIONS

Bader et al., "Integrated Processing Equipment", *Solid State Technology*, May 1990.

Yoshimi, Semiconductor World, Sep. 1990, p. 106.

Kawahara et al., "Reaction Mechanism of Chemical Vapor Deposition Using Tetraethylorthosilicate and Ozone at Atmospheric Pressure," Jpn. J. Appl. Phys., vol. 31 (1992), pp. 2925–2930.

Koshi et al., "Measurements of the Absolute Concentration of H and OH Produced in the $SiH_3 + O_2$ Reaction: Determination of the Product Branching Ratios," J. Phys. Chem. 1993, 97, 4473–4478.

Koshi et al., "Kinetics of the $SiH_3+O_2$ Reaction Studied by Time-Resolved Mass Spectrometry," J. Phys. Chem. 1991, 95, 9869–9873.

Semiconductor International, "Cluster Tools for 1990s Chips", Aug. 1990, pp. 56–63.

Websters Third New International Dictionary of the English Language Unabridged, G&C Merriam Co., Springfield, Mass., © 1965, p. 24.

*Primary Examiner*—Richard Bueker
*Attorney, Agent, or Firm*—Foley & Lardner

[57] ABSTRACT

A substrate such as a semiconductor wafer is transferred to a plurality of process chambers so as to perform prescribed processes. An inspection chamber is air-tightly connected to each of the process chambers. The inspection chamber is provided with a handler which loads and unloads the substrate. A gate valve is disposed between each process chamber and the inspection chamber. By this gate valve, each chamber is air-tightly closed.

13 Claims, 8 Drawing Sheets

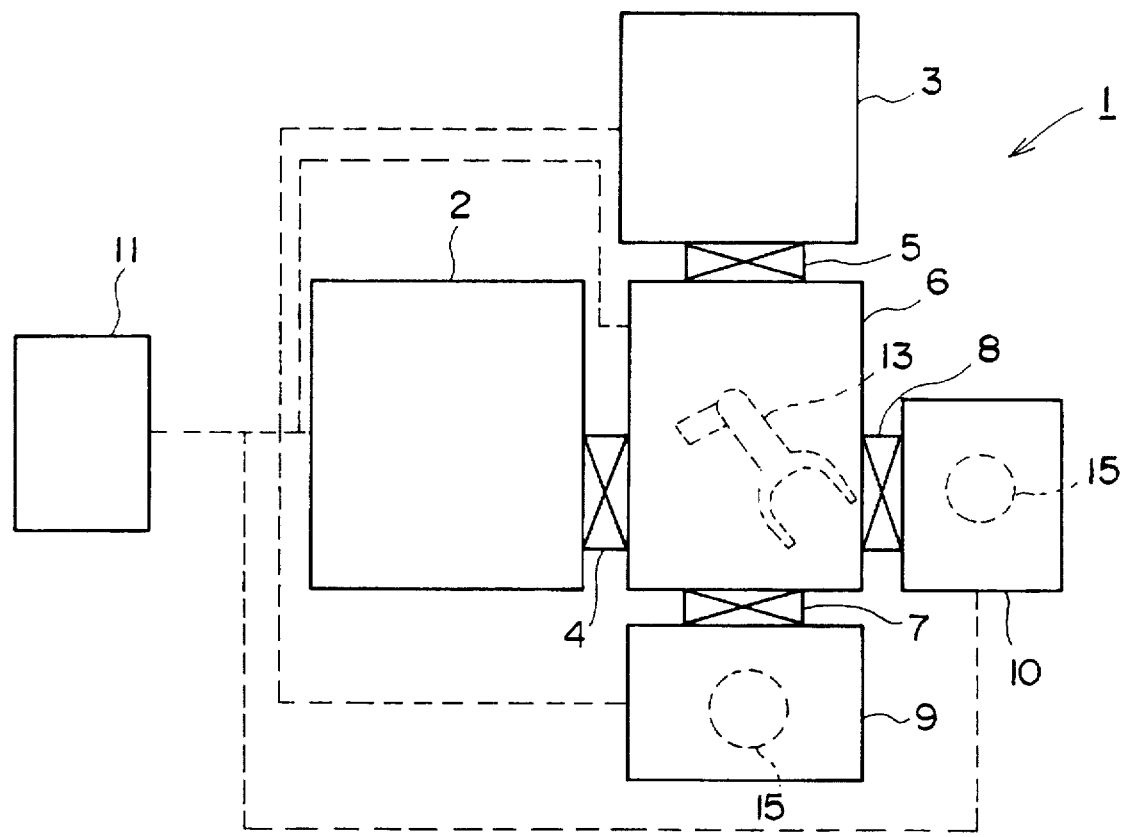
F I G. 1

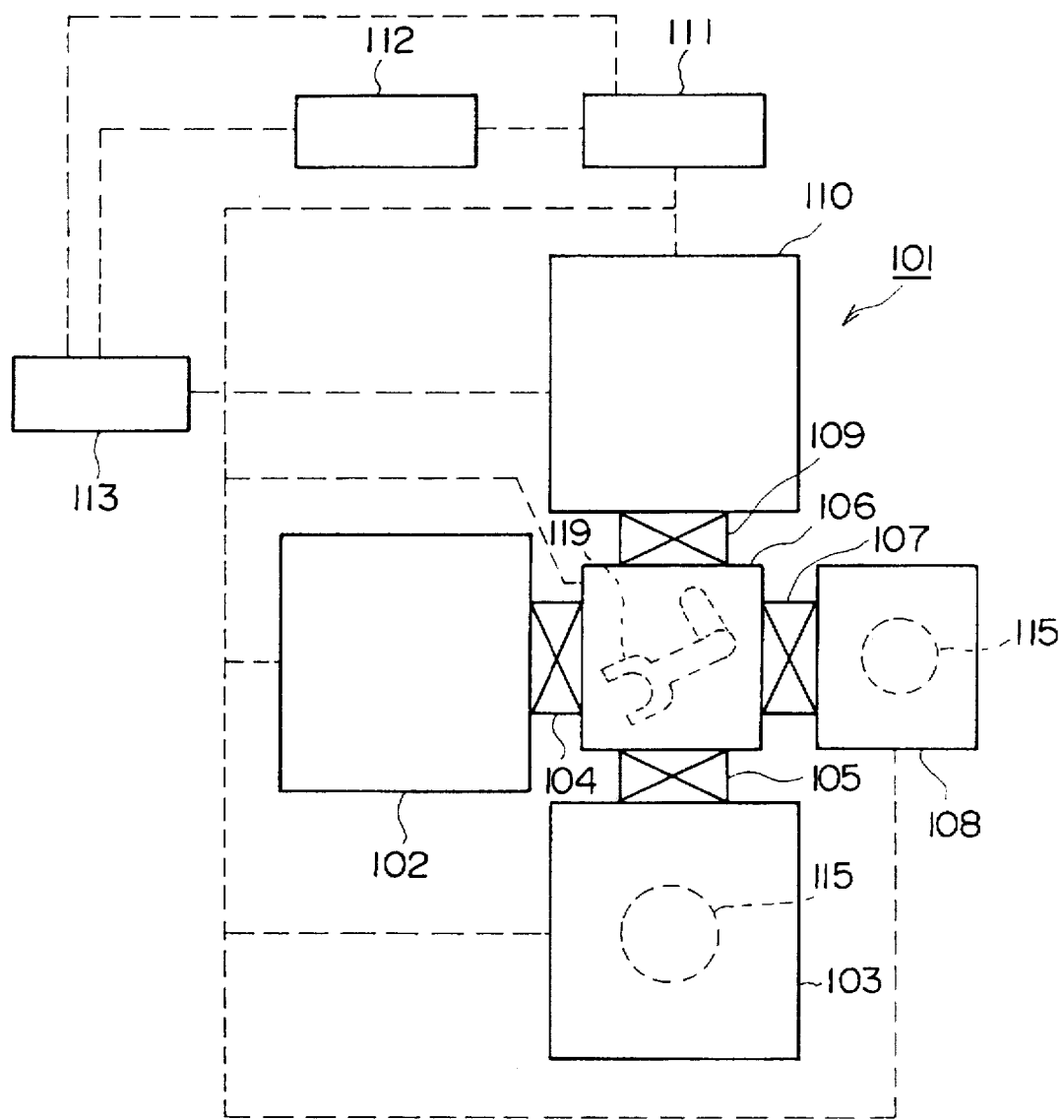
F I G. 3

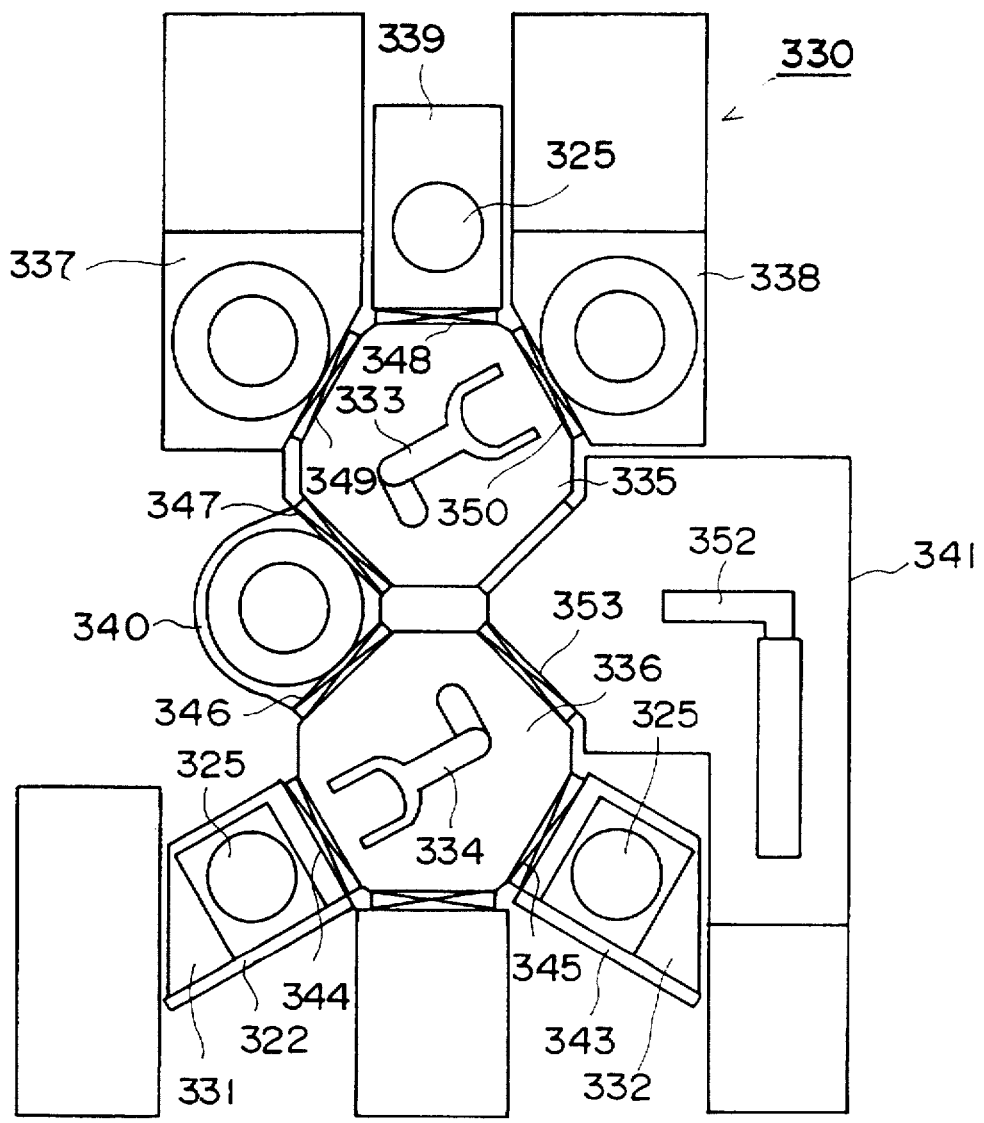
F I G. 7

5,766,360

SUBSTRATE PROCESSING APPARATUS AND SUBSTRATE PROCESSING METHOD

BACKGROUND OF THE INVENTION

1. Field of the Invention

The present invention relates to a substrate processing apparatus for performing prescribed processes (such as performing a thin film growth process) for a semiconductor substrate used for producing a semiconductor device such as a VLSI (Very Large Scale Integration) device and a substrate processing method.

2. Description of the Related Art

Thin film growth technologies for growing a thin film on the surface of a semiconductor substrate are one of the key technologies for enhancing the performance of semiconductor devices. In particular, thin film growth technologies using the CVD (Chemical Vapor Deposition) method have been widely employed.

Conventionally, substrate processing apparatuses of this type, such as a thin film growth apparatus, are designed to perform particular processes such as growing a thin film on the surface of a substrate, such as a semiconductor wafer. The thin film which has been formed on the substrate is evaluated by another apparatus in the next process after the substrate on which the thin film was formed on the surface thereof has been unloaded from the thin film forming apparatus (substrate processing apparatus).

Thus, it takes a long time for the result of evaluation of the thin film which has been formed on the substrate to be obtained.

However, in this case, while the substrate is being processed and evaluated, the surface of the thin film may be contaminated or the characteristics of the film may change.

In a single wafer processing apparatus, from the view point of quality assurance of a processed substrate, the evaluation of the process should be performed with a high frequency. Thus, when the substrate is evaluated by another apparatus, much labor and time are consumed. In addition, when the evaluation of the process result takes a long time, unnecessary processes will be continued for a defective substrate.

SUMMARY OF THE INVENTION

The present invention has been made in view of the above described difficulties. An object of the present invention is to provide a substrate processing apparatus and a substrate processing method by which a thin film and the like can be quickly easily evaluated almost immediately after the thin film and the like have been formed and by which the yield of the growth of the thin film can be increased.

The present invention in a first aspect thereof provides a substrate processing apparatus, comprising a process chamber for performing a prescribed process for a semiconductor substrate, an inspection chamber, connected to the process chamber, for performing a predetermined analysis for the semiconductor substrate, and a transfer means for loading and unloading the semiconductor substrate between the process chamber and the inspection chamber.

The present invention in a second aspect thereof provides a substrate processing apparatus, comprising a thin film growth chamber for forming a thin film on the surface of the semiconductor substrate, a gas supply unit for supplying a supply gas to the thin film growth chamber, a gas exhaust unit for exhausting a gas from the thin film growth chamber, an exhaust gas analyzing unit, connected to the gas exhaust unit, for analyzing the amount, the composition or both the amount and composition of an exhaust gas, and a record/analysis/determination means, for setting the amount and composition of the supply gas supplied to the thin film growth chamber and process conditions of the thin film growth chamber, wherein the record/analysis/determination means is adapted to evaluate a thin film of the semiconductor substrate according to an exhaust gas analytic result received from the exhaust gas analyzing unit.

The present invention in a third aspect thereof provides a substrate processing apparatus, comprising a plurality of process chambers for performing prescribed processes with respect to a semiconductor substrate, and a plurality of transfer chambers, connected to the process chambers, the transfer chambers having transfer means for loading and unloading the semiconductor substrate to each of the process chambers, wherein a load lock chamber having a load lock mechanism is disposed between the transfer chambers, the load lock mechanism being adapted to substitute the atmosphere in the transfer chamber with air atmosphere or vacuum atmosphere.

The present invention in a fourth aspect thereof provides a substrate processing method of a semiconductor substrate processing apparatus having a process chamber for performing a prescribed process with respect to a semiconductor substrate, an inspection chamber, connectable to the process chamber, for performing a predetermined analysis for the semiconductor substrate, and a transfer means for loading and unloading the semiconductor substrate between the process chamber and the inspection chamber, the method comprising the steps of (a) analyzing the semiconductor substrate in the inspection chamber and storing analytic information in an analytic information storage means, (b) transferring the semiconductor substrate from the inspection chamber to the outside thereof, and (c) analyzing the analytic information, wherein the transfer means is adapted to perform the step (b), and wherein an analytic information analysis means is adapted to perform the step (c).

The present invention in a fifth aspect thereof provides a substrate processing method for supplying a supply gas to a thin film growth chamber and for evaluating a thin film formed on the surface of a semiconductor substrate disposed in the thin film growth chamber, the method comprising the steps of setting the amount and composition of the supply gas supplied to the thin film growth chamber and process conditions of the thin film growth chamber, and analyzing the amount, the composition or both the amount and composition of an exhaust gas exhausted from the thin film growth chamber and evaluating the thin film according to an analytic result of the exhaust gas.

These and other objects, features and advantages of the present invention will become more apparent in light of the following detailed description of best mode embodiments thereof, as illustrated in the accompanying drawings.

BRIEF DESCRIPTION OF DRAWINGS

FIG. 1 is a schematic diagram showing the basic construction of a substrate processing apparatus and a substrate processing method of a first embodiment according to the present invention;

FIG. 3 is a schematic diagram showing the basic construction of a second embodiment according to the present invention;

FIG. 7 is a schematic diagram showing a modification of the fourth embodiment.

DESCRIPTION OF PREFERRED EMBODIMENTS

First Embodiment

Now, with reference to the accompanying drawings, the first embodiment of the present invention will be described.

Figure 2:
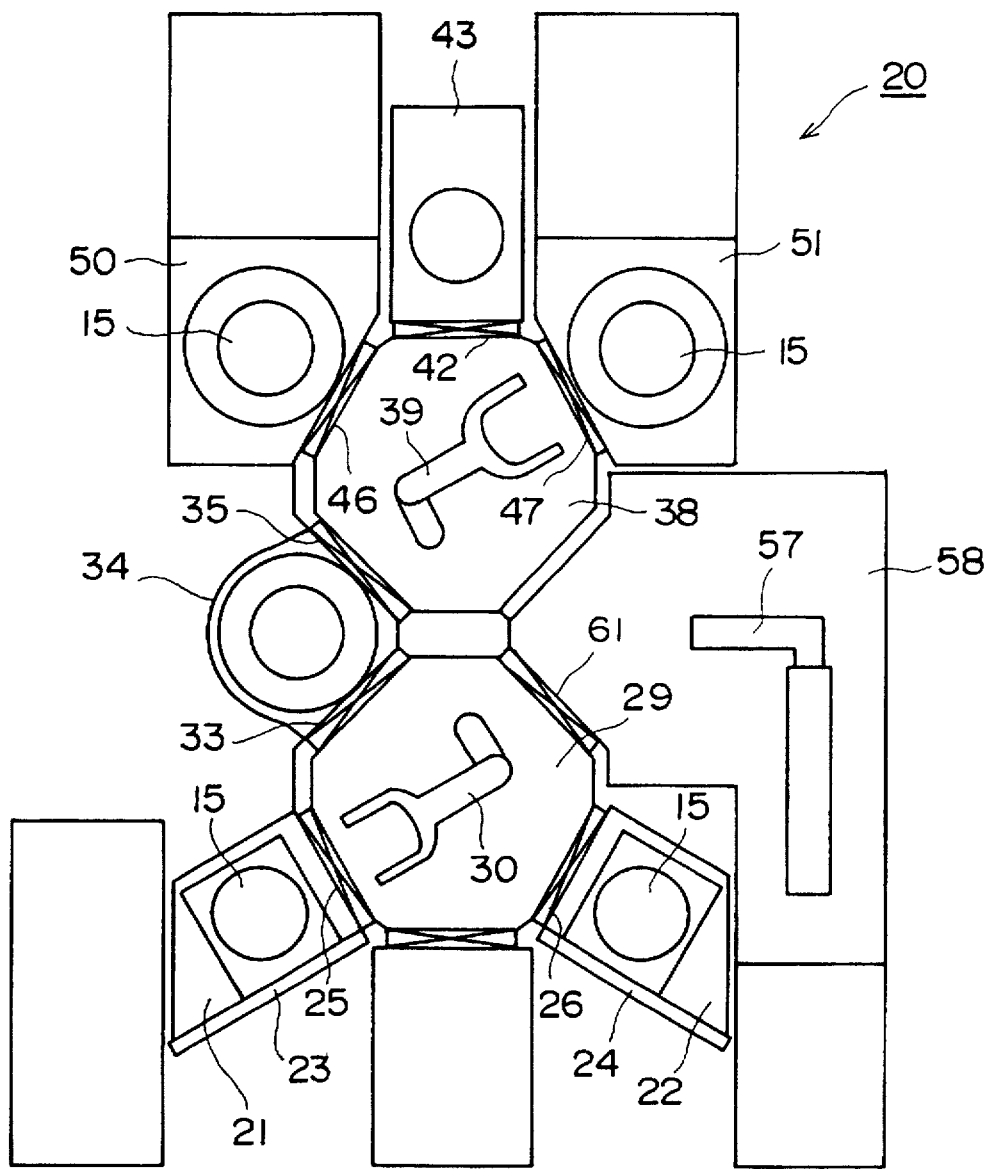
FIG. 2 is a schematic diagram showing a modification of the first embodiment.

FIGS. 1 and 2 are schematic diagrams showing a thin film growth apparatus according to a first embodiment of the present invention, FIG. 1 showing the basic construction thereof. In FIG. 1, reference numeral 1 designates the thin film growth apparatus. The thin film growth apparatus 1 comprises two process chambers which are a thin film growth chamber 2 and a substrate pre-process chamber 3. The thin film growth chamber 2 grows a thin film on a substrate. The substrate pre-process chamber 3 performs a pre-process such as etching a substrate. The process chambers 2 and 3 are connected to an inspection chamber 6 through gate valves 4 and 5, respectively. The inspection chamber 6 performs prescribed analyses of a semiconductor substrate 15. In addition, the inspection chamber 6 is connected to a defective substrate storage chamber 9 and a load/unload chamber 10 through gate valves 7 and 8, respectively. Moreover, the inspection chamber 6 has a transfer means such as a handler 13. The handler 13 transfers a semiconductor substrate 15 between each chamber. The thin film growth apparatus 1 further comprises a control unit 11 which controls the chambers 2 and 3, the inspection chamber 6, the defective substrate storage chamber 9, the load/unload chamber 10, the handler 13, and the gate valves 4, 5, 7, and 8.

Substrates 15 which are held in a cassette or the like are transferred from a clean room (not shown in the figure). The substrates 15 are set in the load/unload chamber 10. Next, the atmosphere in the load/unload chamber 10 is substituted with the atmosphere of a vacuum, an inert gas, or another gas such as $H_2$. The substrates 15 are transferred sheet by sheet to the inspection chamber 6 by the handler 13 which operates in an interlocking relationship with the open and close operations of the gate valve 8. The inspection chamber 6 measures the surface distribution of the thickness of the substrate 15. Thereafter, the substrate 15 is transferred from the inspection chamber 6 to the substrate pre-process chamber 3 by the handler 13 which operates in an interlocking relationship with the open and close operations of the gate valve 5.

The substrate pre-process chamber 3 performs a pre-process such as removing a natural oxide film formed on the surface of the substrate 15. For example, the substrate pre-process chamber 3 deaerates air or gas from the inside thereof and sprays an HF (hydrogen fluoride) gas or vapor gas on the surface of the substrate 15 so as to dry-etch the natural oxide film on the surface of the substrate 15. Then, the substrate 15 is transferred from the substrate pre-process chamber to the inspection chamber 6 by the handler 13 which operates in an interlocking relationship with the open and close operations of the gate valve 5.

Next, the inspection chamber 6 analyzes the surface of the substrate 15 received from the pre-process chamber 3 so as to inspect and determine whether or not the natural oxide film is present on the surface of the substrate 15. After the inspection chamber 6 determines that the natural oxide film is absent from the surface of the substrate 15, the substrate 15 is transferred from the inspection chamber 6 to the thin film growth chamber 2 by the handler 13 which operates in an interlocking relationship with the open and close operations of the gate valve 4. When the natural oxide film is present on the surface of the substrate 15, the substrate 15 is transferred from the inspection chamber 2 to the substrate pre-process chamber 3 so as to remove the natural oxide film therefrom. If the natural oxide film cannot be removed from the substrate 15 with the removing process performed a specific number of times, the substrate 15 is transferred from the substrate pre-process chamber 3 to the defective substrate storage chamber 9 or the load/unload chamber 10 without the thin film growth process. It should be noted that the surface of the substrate 15 can be analyzed by the substrate pre-process chamber 3 rather than the inspection chamber 6.

The thin film growth chamber 2 performs a thin film growth process for the substrate 15. For example, the thin film growth chamber 2 supplies $SiH_4$ and $H_2$ gases while heating the substrate 15. The substrate 15 is for example a semiconductor wafer of Si (silicon) single crystal substrate. Thereafter, the substrate 15 is transferred from the thin film growth chamber 2 to the inspection chamber 6 by the handler 13 which operates in an interlocking relationship with the open and close operations of the gate valve 4.

The inspection chamber 6 inspects the substrate 15 for necessary inspection items selected from evaluation items such as the thickness of growth film, resistivity, composition, surface conditions, particles, metal impurities, crystal defects, and film interface conditions.

In this case, the thickness of the growth thin film can be obtained by measuring the surface distribution of the total thickness of the substrate and the growth thin film and comparing it with the thickness of the original substrate. In this manner, even for a specimen which cannot be measured without being destroyed for measurement, the film thickness thereof can be positively and non-destructively measured.

The resistivity can be measured by using a contact method such as the four-terminal method. The position of the measurement of the resistivity should be selected so that the orientation flat of the substrate 15 always becomes constant. This position is preferably a position which is not used for a device on the substrate 15. In addition, the resistivity can be measured by a non-contact method such as the eddy current method.

When the growth thin film of the substrate 15 deviates from a predetermined standard, the control unit 11 receives a relevant signal from the inspection chamber 6 and determines that the growth thin film is defective. The inspection result of each substrate 15 is recorded and stored in the control unit 11. The inspection result can be referenced in the later processes.

The thin film growth chamber 2 may be of a batch type instead of a single wafer processing type. In the case of the single wafer processing type, a growth thin film on a substrate 15 may be inspected. When a test piece is used, a growth test piece may be inspected.

The metal impurities can be inspected by for example an emission spectrochemical analysis. However, this inspection generally takes a long time. This time is longer than the time for which a thin film grows. Thus, a sampling test is performed. By preparing a plurality of inspection units in the inspection chamber 6, the throughput of the inspections can be improved.

When defective substrates 15 occur frequently, the control unit 11 issues an alarm so as to minimize the defective ratio of the substrates 15. However, it is possible to automatically stop the apparatus 1. When the film growth conditions can be fed back, if the inspection result deviates largely from the standard value of the thin film, the control unit 11 can feed back the data to the thin film growth chamber 2.

When a substrate 15 is determined to be defective, the subsequent inspections or processes are be omitted. When a particular substrate 15 cannot be removed from the process sequence, the processes can be continued.

It should be noted that the above-mentioned process sequence is only an example and is not a limitation thereof. For example, if necessary, inspections before the thin film growth process can be omitted, these inspections including the pre-process.

In the process sequence, although it is preferable not to expose the substrate to exterior gas such as air, the present invention is not limited thereto.

The entire apparatus can be disposed in a vacuum atmosphere, an inert atmosphere, or another controlled gas atmosphere.

FIG. 2 is a schematic diagram showing a modification of the first embodiment. In the figure, reference numeral 20 designates a thin film growth apparatus. The thin film growth apparatus comprises two load/unload chambers 21 and 22, two handler chambers 29 and 39, and four process chambers. These process chambers are connected to each of the handler chambers 29 and 39. The process chambers are a substrate pre-process chamber 34, two thin film growth chambers 50 and 51, an orientation flat alignment chamber 43, and an inspection chamber 58. The substrate pre-process chamber 34 performs pre-processes. The thin film growth chambers 50 and 51 grow thin films on substrates. The orientation flat alignment chamber 43 aligns a substrate 15 with an orientation flat disposed thereon. The inspection chamber 58 performs various analyses similar to those performed by the inspection chamber of the embodiment shown in FIG. 1.

Substrates 15 which were pre-processed and held in cassettes or the like are transferred from for example a clean room (not shown in the figure) and set in the chambers 21 and 22 through doors 23 and 24 thereof.

The substrates 15 set in the first and second load/unload chambers 21 and 22 are transferred sheet by sheet to the handler chamber (transfer chamber) 29 by a first handler (transfer means) 30 disposed therein, the first handler 30 operating in an interlocking relationship with the open and close operations of gate valves 25 and 26. Next, a substrate 15 is transferred from the first handler chamber 29 to the substrate pre-process chamber 34 by the first handler 30 which operates in an interlocking relationship with the open and close operations of a gate valve 33. After the substrate 15 is loaded in the substrate pre-process chamber 34, the pre-process chamber 34 deaerates gas or air from the inside thereof and performs a pre-process such as etching a natural oxide substance on the surface of the substrate 15 with a HF (hydrogen fluoride) gas or the like.

Next, the substrate 15 is transferred from the pre-process chamber 34 to the second handler chamber 38 by a second handler 39 disposed therein, the second handler 39 operating in an interlocking relationship with the open and close operations of a gate valve 35. Then, the substrate 15 in the handler chamber 38 is transferred to the orientation flat alignment chamber 43 by the second handler 39 which operates in an interlocking relationship with the open and close operations of a gate valve 42.

The orientation flat alignment chamber 43 detects the position of the orientation flat disposed on the substrate 15 and aligns the position of the substrate 15 in a predetermined direction. When the orientation flat alignment process is not necessary or another orientation flat alignment process is used, the orientation flat alignment chamber 43 can be omitted. In addition, the orientation flat alignment chamber 43 can obtain the thickness of a growth thin film by measuring the thickness of the substrate 15 before and after the thin film is grown.

Thereafter, the substrate 15 is transferred from the orientation flat alignment chamber 43 to the first or second thin film growth chamber 50 or 51 by the second handler 39 which operates in an interlocking relationship with the open and close operations of a gate valve 46 or 47, respectively. When a HF gas was used in the pre-process (etching process), the thin film growth chamber 50 or 51 radiates ultraviolet rays to the surface of the substrate 15 so as to remove the F (fluorine) therefrom. Thereafter, the thin film growth chamber 50 or 51 performs a prescribed thin film growth process while supplying predetermined gases so as to form a thin film on the surface of the substrate 15.

After the thin film growth process is completed, the substrate 15 is transferred from the first or second thin film growth chamber 50 or 51 to the second handler chamber 38 by the second handler 39 which operates in an interlocking relationship with the open and close operations of a gate valve 46 or 47, respectively. The substrate 15 in the handler chamber 38 is transferred to the substrate pre-process chamber 34 by the second handler 39 which operates in an interlocking relationship with the open and close operations of a gate valve 35. Thereafter, the substrate 15 is transferred from the first handler chamber 29 to the inspection chamber 58 by the first handler 30 which operates in an interlocking relationship with the open and close operations of gate valves 33 and 61.

As in the embodiment shown in FIG. 1, the inspection chamber 58 performs various measurements and inspections for the thin film formed on the substrate 15.

After these inspections are completed, the substrate 15 is transferred from the inspection chamber 58 to the first handler chamber 29 by the first handler 30 which operates in an interlocking relationship with the open and close operations of a gate valve 61. Thereafter, the substrate 15 in the handler chamber 29 is held in a cassette disposed in the first or second load/unload chamber 21 or 22 by the handler 30. Thus, the process sequence is completed.

The substrate pre-process chamber 34 is provided with a load lock mechanism which changes the atmosphere in the chamber 34 to air atmosphere or vacuum atmosphere. The volume of the substrate pre-process chamber 34 is less than that of each of the other chambers 21, 22, 29, 38, 43, 50, 51, and 58. Thus, the deaerating process or air atmosphere restoring process can be easily performed.

As described above, according to the above-mentioned embodiment, almost just after a thin film was grown, it can be quickly evaluated. Thus, the yield of the thin film and so forth can be improved and the decrease of the throughput of the apparatus can be minimized. In addition, the quality assurance of the thin film and so forth can be easily performed.

Second Embodiment

Figure 4:
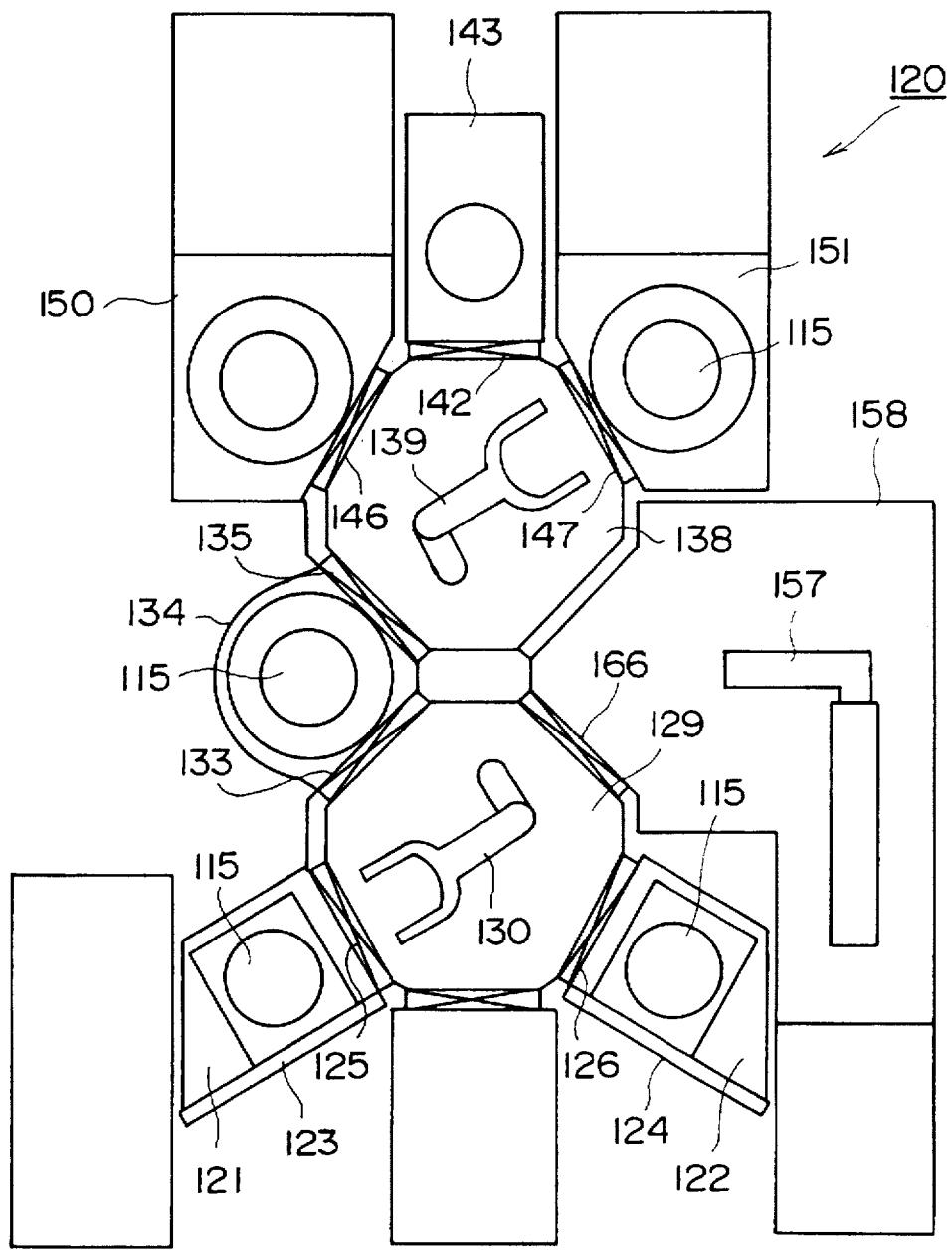
FIG. 4 is a schematic diagram showing a modification of the second embodiment.

FIGS. 3 and 4 are schematic diagrams showing a thin film growth apparatus according to a second embodiment of the present invention, FIG. 3 showing the basic construction thereof. In FIG. 3, reference numeral 101 is a thin film growth apparatus which comprises two process chambers: a thin film growth chamber 102 and a substrate pre-process chamber 103. The thin film growth chamber 102 performs a thin film growth process for growing a thin film on a substrate 115. The substrate pre-process chamber 103 performs a pre-process such as etching the substrate 115. The process chambers 102 and 103 are connected to a handler chamber 106 through gate valves 104 and 105. The handler chamber 106 has a handler 119. The handler chamber 106 is connected to a load/unload chamber 108 through a gate valve 107. In addition, the handler chamber 106 is connected to an inspection chamber 110 through a gate valve 109.

Analytic information of the substrate 115 obtained by the inspection chamber 110 is stored in an analytic information storage means 111. The information stored in the analytic information storage means 111 is retrieved and analyzed by an analytic information analysis means 112. The analytic result of the analytic information analysis means 112 is sent to a control means 113. The control means 113 controls the process chambers 102 and 103, the handler chamber 106, the load/unload chamber 108, the inspection chamber 109, and the analytic information storage means 111. As described above, analytic information stored in the analytic information storage means 111 is analyzed by the analytic information analysis means 112 and thereby the analytic result is obtained. The analytic result is sent to the control means 113.

Substrates which are held in a cassette or the like and transferred from a clean room (not shown in the figure) are set in the load/unload chamber 108. Thereafter, the substrates 115 are transferred sheet by sheet to the handler chamber 106 by the handler 119 which operates in an interlocking relationship with the open and close operations of the gate valve 107. Thereafter, a substrate 115 is transferred from the load/unload chamber 108 to the substrate pre-process chamber 103 by the handler 119 which operates in an interlocking relationship with the open and close operations of the gate valve 105.

The substrate pre-process chamber 103 performs a pre-process such as removing an organic substance, a natural oxide film, and so forth adhering to the surface of the substrate (semiconductor wafer) 115. The substrate pre-process chamber 103 deaerates air or gas from the inside thereof and sprays a HF (hydrogen fluoride) gas, vapor gas, or the like to the surface of the substrate 115 so as to dry-etch a natural oxide film on the surface of the substrate 115. After the pre-process of the substrate 115 is completed, the substrate 115 is transferred from the pre-process chamber 103 to the handler chamber 106 by the handler 119 which operates in an interlocking relationship with the open and close operations of the gate valve 105. Thereafter, the substrate 115 is transferred from the handler chamber 106 to the inspection chamber 110 by the handler 119 which operates in an interlocking relationship with the open and close operations of the gate valve 109.

Using for example an ellipsometer, the inspection chamber 110 analyzes the surface of the semiconductor substrate 115 which was pre-processed so as to determine whether or not the result of the pre-process is proper. In other words, with the ellipsometer, the film thickness of five points on the surface of the semiconductor substrate 115 is measured. In this case, the polarizing angle and light intensity of five points are measured. The resultant data (analytic information) is stored in the analytic information storage means 111. Thereafter, the substrate 115 is transferred from the inspection chamber 110 to the handler chamber 106 by the handler 119 which operates in an interlocking relationship with the open and close operations of the gate valve 109.

The measurement for obtaining analytic information of light intensity normally takes a time on the order of several seconds. However, the analysis of this information for obtaining the film thickness takes a time on the order of several minutes. Thus, the analytic information obtained in the inspection chamber 110 is temporarily stored in the analytic information storage means 111. Thereafter, the substrate 115 is transferred from the inspection chamber 110 to the handler chamber 106. During subsequent processes of the substrate 115 (such as a substrate transfer process and performing an epitaxial growth process), the above-mentioned analytic information is retrieved from the analytic information storage means 111 and analyzed by the analytic information analysis means 112. Since the film thickness data is analyzed by the analytic information analysis means 112 after the substrate 115 is transferred from the inspection chamber 110 to the outside thereof, the time necessary for analyzing the analytic information can be shortened.

In other words, if the substrate 115 is transferred from the inspection chamber 110 to the handler chamber 106 after the analytic information was analyzed, due to a waiting time for the analysis time on the order of several minutes, the throughput decreases. However, since the analysis by the analytic information analysis means 112 is performed while other processes of the substrate 115 are being performed, the process time can be shortened.

Next, the substrate 115 is transferred from the handler chamber 106 to the thin film growth chamber 102 by the handler 119 which operates in an interlocking relationship with the open and close operations of the gate valve 104. It should be noted that the surface analysis of the substrate 115 can be performed by the substrate pre-process chamber 103 rather than the inspection chamber 110.

The thin film growth chamber 102 performs an epitaxial growth process for the substrate 115 by supplying a $SiH_4$ gas and a $H_2$ gas while heating the substrate 115. The substrate 115 is a Si (silicon) single crystal substrate. After the epitaxial growth process is completed, the substrate 115 is transferred from the thin film growth chamber 102 to the handler chamber 106 by the handler 119 which operates in an interlocking relationship with the gate valve 104. Thereafter, the substrate 115 is transferred from the handler chamber 106 to the inspection chamber 110 by the handler 119 which operates in an interlocking relationship with the open and close operations of the gate valve 109.

Thereafter, the inspection chamber 110 inspects the substrate 15 for necessary inspection items selected from evaluation items such as the thickness of growth film, resistivity, composition, surface conditions, particles, metal impurities, crystal defects, and film interface conditions. For example, the film thickness of the substrate on which a thin film was grown is measured by FTIR (Fourier Transform Infrared Spectrophotometer).

In the analysis using the FTIR, to obtain analytic information of one point, it takes several seconds. However, to analyze the analytic information and to calculate the required film thickness, it takes several ten seconds. Thus, in the same manner as the pre-process, the analytic information obtained by the inspection chamber 110 is temporarily stored in the analytic information storage means 111. Next, the substrate 115 is transferred from the inspection chamber 110 to the handler chamber 106. While a subsequent process for the substrate 115 is being performed (namely, during a handling process in which the next substrate 115 is being transferred to the inspection chamber 110), the analytic information is analyzed by the analytic information analysis means 112. When the analytic information analysis means 112 analyzes measured data of epitaxial film thickness, the time necessary for measuring the film thickness can be shortened.

The analysis items inspected by the inspection chamber 110 are not limited to those described above. Besides the film thickness of the substrate 115, after supply gas and exhaust gas of the thin film growth chamber 102 and the substrate pre-process chamber 103 are analyzed, the analytic information can be sent to the analytic information storage means 111 so as to analyze the analytic information.

It should be noted that the above-mentioned process sequence and the construction of the apparatus are only examples, and are not limitations. For example, if necessary, inspections before the thin film growth process can be omitted, the inspections including the pre-processing step.

FIG. 4 is a schematic diagram showing a modification of the second embodiment. In the figure, reference numeral 120 is a thin film growth apparatus. The thin film growth apparatus comprises two load/unload chambers 121 and 122, two handler chambers 129 and 138, and four process chambers. These process chambers are connected to each of the handler chambers 129 and 138. The process chambers are a substrate pre-process chamber 134, two thin film growth chambers 150 and 151, an orientation flat alignment chamber 143, and an inspection chamber 158. The substrate pre-process chamber 134 performs pre-processes. The thin film growth chambers 150 and 151 grow thin films on substrates. The orientation flat alignment chamber 143 aligns a substrate 115 with an orientation flat disposed thereon. The inspection chamber 158 performs various analyses similar to those performed by the inspection chamber of the embodiment shown in FIG. 3.

Substrates 115 which were pre-processed and held in cassettes or the like are transferred from for example a clean room (not shown in the figure) and set in the chambers 121 and 122 through doors 123 and 124 thereof.

The substrates 115 set in the first and second load/unload chambers 121 and 122 are transferred sheet by sheet to the handler chamber 129 by a first handler 130 disposed therein, the first handler 130 operating in an interlocking relationship with the open and close operations of gate valves 125 and 126. Next, a substrate 115 is transferred from the first handler chamber 129 to the substrate pre-process chamber 134 by the first handler 130 which operates in an interlocking relationship with the open and close operations of a gate valve 133. After the substrate 115 is loaded in the substrate pre-process chamber 134, the pre-process chamber 134 deaerates gas or air from the inside thereof and performs a pre-process such as etching a natural oxide substance on the surface of the substrate 115 with a HF (hydrogen fluoride) gas or the like.

Next, the substrate 115 is transferred from the pre-process chamber 134 to the second handler chamber 138 by a second handler 139 disposed therein, the second handler 139 operating in an interlocking relationship with the open and close operations of a gate valve 135. Then, the substrate 115 in the handler chamber 138 is transferred to the orientation flat alignment chamber 143 by the second handler 139 which operates in an interlocking relationship with the open and close operations of a gate valve 142.

The orientation flat alignment chamber 143 detects the position of the orientation flat disposed on the substrate 115 and aligns the position of the substrate 115 in a predetermined direction. When the orientation flat alignment process is not necessary or another orientation flat alignment process is used, the orientation flat alignment chamber 143 can be omitted. In addition, the orientation flat alignment chamber 143 can obtain the thickness of a growth thin film by measuring the thickness of the substrate 115 before and after the thin film is grown.

Thereafter, the substrate 115 is transferred from the orientation flat alignment chamber 143 to the first or second thin film growth chamber 150 or 151 by the second handler 139 which operates in an interlocking relationship with the open and close operations of a gate valve 146 or 147, respectively. When a HF gas is used in the pre-process (etching process), the thin film growth chamber 150 or 151 radiates ultraviolet rays to the surface of the substrate 115 so as to remove the F (fluorine) therefrom. Thereafter, the thin film growth chamber 150 or 151 performs a prescribed thin film growth process while supplying prescribed gases so as to form a thin film on the surface of the substrate 115.

After the thin film growth process is completed, the substrate 115 is transferred from the first or second thin film growth chamber 150 or 151 to the second handler chamber 138 by the second handler 139 which operates in an interlocking relationship with the open and close operations of a gate valve 146 or 147, respectively. The substrate 115 in the handler chamber 138 is transferred to the substrate pre-process chamber 134 by the second handler 139 which operates in an interlocking relationship with the open and close operations of a gate valve 135. Thereafter, the substrate 115 is transferred from the first handler chamber 129 to the inspection chamber 158 by the first handler 130 which operates in an interlocking relationship with the open and close operations of gate valves 133 and 166.

As in the embodiment shown in FIG. 3, a measurement unit 157 disposed in the inspection chamber 158 performs various measurements and inspections for the thin film formed on the substrate 115. This analytic information is temporarily stored in the analysis information storage means 111 (see FIG. 3). While the substrate 115 is being processed, the analytic information is analyzed by the analytic information analysis means 112 (see FIG. 3).

After necessary analytic information is obtained in the inspection chamber 158, the substrate 115 is transferred from the inspection chamber 158 to the first handler chamber 129 by the first handler 130 which operates in an interlocking relationship with the open and close operations of the gate valve 166. Thereafter, the substrate 115 in the handler chamber 129 is held in a cassette disposed in the first or second load/unload chamber 121 or 122 by the handler 130. Thus, the process sequence is completed.

The substrate pre-process chamber 134 is provided with a load lock mechanism which changes the atmosphere in the chamber 134 to air atmosphere or vacuum atmosphere. The volume of the substrate pre-process chamber 134 is less than that of each of other chambers 121, 122, 129, 138, 143, 150, 151, and 158. Thus, the deaerating process or air atmosphere restoring process can be easily performed.

As described above, according to the above-mentioned embodiment, a thin film which was grown on a substrate can be evaluated while another process is being performed. Thus, the evaluation of the thin film can be quickly performed. Therefore, the yield of the thin film and so forth can be improved and the decrease of the throughput of the apparatus can be minimized.

Third Embodiment

Figure 5:
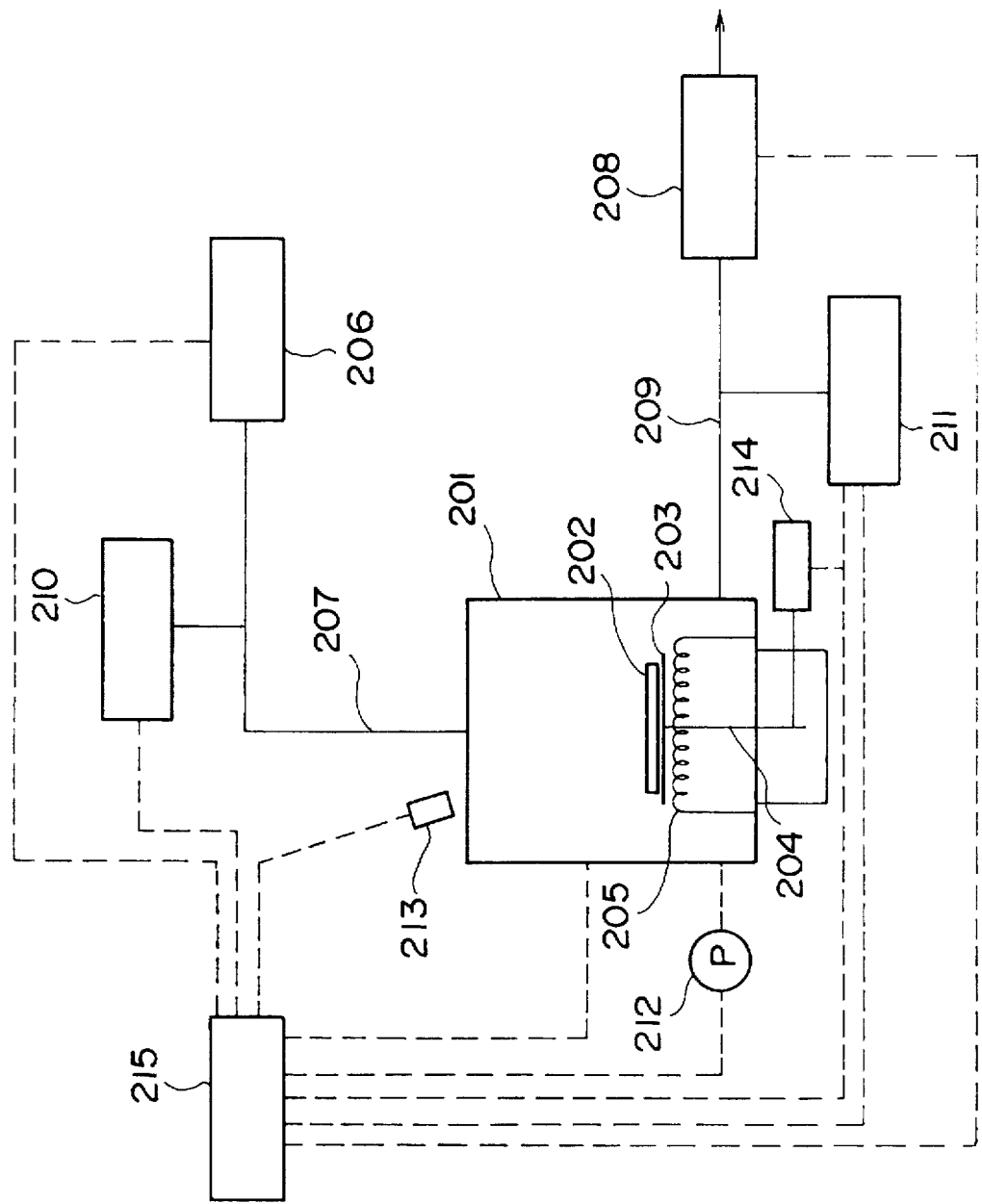
FIG. 5 is a schematic diagram showing the basic construction of a third embodiment according to the present invention.

FIG. 5 is a schematic diagram showing a thin film growth apparatus according to a third embodiment of the present invention. In the figure, the thin film growth apparatus has a thin film growth chamber 201 which is airtightly disposed therein. The thin film growth chamber 201 has a substrate holder 203 disposed at the upper end of a rotatable rotation shaft 204, the substrate holder 203 holding a substrate 202. Below the substrate holder 203, a heater 205 which heats the substrate 202 and the substrate holder 203 is disposed.

An upper portion of the thin film growth chamber 201 is connected to a gas supply unit 206 through a supply pipe 207. A lower portion of the thin film growth chamber 201 is connected to an exhaust unit 208 through an exhaust pipe 209.

The substrate 202 is mounted on the upper surface of the substrate holder 203. The substrate 202 is heated by the heater 205 to a prescribed temperature (from several hundred degrees centigrade to one thousand and several hundred degrees centigrade). Next, the gas supply unit 206 supplies a raw material gas (for example, $AsH_3$, $SiH_4$, or $SiH_2$) and a carrier gas (for example, $H_2$) to the thin film growth chamber 201 so as to grow a thin film on the substrate 202. When a silicon film is grown on the substrate 202, a raw material gas such as $SiH_2Cl_2$, $SiH_4$, or $Si_2H_6$ is used. In this case, the carrier gas can be omitted.

When the substrate 202 is doped, a gas such as $PH_3$ or $B_2H_6$ is used. The thin film to be grown is not limited to a silicon film, but other films such as a semiconductor film, an insulation film, a metal film, and an electrolysis film. When a thin film is grown, the rotation shaft 204 is rotated at for example 500 rpm or more so as to rotate the substrate holder 203 and the substrate 202. At this point, the chamber is deaerated by the exhaust unit 208 so that the pressure therein becomes constant (for example, from several Torr to several hundred Torr).

A supply gas analysis unit 210 is disposed in the middle of the supply pipe 207. An exhaust gas analysis unit 211 is disposed in the middle of the exhaust pipe 209. The thin film growth chamber 201 is provided with a pressure gauge 212, a radiation thermometer 213, and a rotation meter 214. The pressure gauge 212 monitors the pressure of the thin film growth chamber 201. The radiation thermometer 213 monitors the temperature of the substrate (semiconductor wafer) 202. The rotation meter 214 monitors the rotational speed of the rotation shaft 204. These units and meters 210 to 214 are connected to a record/analysis/determination means 215.

The supply gas analysis unit 210 samples and analyzes the supply gas supplied from the gas supply unit 206 through the supply pipe 207 by using for example FTIR (Fourier Transform Infrared Spectrophotometer) method. This gas analysis can be performed by using another analysis means such as gas chromatography method or QMS (Quadrupole Mass Spectrum) method. Besides the sampling method, the gas which flows in the supply pipe 207 can be analyzed.

The exhaust gas analysis unit 211 samples and analyzes the exhaust gas exhausted to the exhaust unit 208 through the exhaust pipe 209 by using for example FTIR (Fourier Transform Infrared Spectrophotometer) method. The gas can be analyzed by another means.

The record/analysis/determination means 215 sets the temperature of the substrate 202, the growth pressure in the thin film growth chamber 201, the rotational speed of the rotation shaft 204, the amount and component of the supply gas and stores these set values. In addition, the record/analysis/determination means 215 stores the temperature of the substrate, the pressure in the thin film growth chamber, the rotational speed of the rotation shaft, the amount and component of the supply gas, and the amount and component of the exhaust gas as reference values obtained when a standard thin film is grown.

Moreover, the record/analysis/determination means 215 receives various information from the units and meters 210 to 214 and compares them with reference information which has been stored so as to evaluate the thin film formed on the surface of the substrate 202.

In other words, in the range of reproducibility of the apparatus, when the same growth conditions are given, the same thin film should be formed. The growth conditions have been set before the thin film is grown. Normally, the thin film is grown as set in the growth conditions. However, when a thin film is actually grown, the conditions in the thin film growth chamber 201 slightly differ in each thin film. Thus, the quality of each thin film deviates.

In this case, the amount and composition of the supply gas, the temperature of the substrate, the growth pressure, and the number of rotations of the substrate which largely affect the growth of the thin film are monitored. In addition, the amount and composition of the exhaust gas exhausted from the thin film growth chamber 201 are monitored. With the data monitored, it is determined whether or not the conditions in the thin film growth chamber 201 are in a predetermined range. These data are totally determined so as to assure the quality of the thin film.

In other words, the record/analysis/determination means 215 compares the monitored results of the growth substrate temperature, the growth pressure, and the rotational speed of the substrate received from the units and meters 212 to 214 with predetermined set values so as to determine whether or not the growth thin film is in an allowable deviation range of the predetermined set values.

Next, the record/analysis/determination means 215 compares the results of gas analyses received from the supply gas analysis unit 210 and the exhaust gas analysis unit 211 with the reference values. In this process, the record/analysis/determination means 215 determines whether or not the components and amount of the supply gas supplied to the thin film growth chamber 201 are in allowable ranges. Next, the record/analysis/determination means 215 determines whether or not the components and amount of the exhaust gas are in allowable ranges. With the analytic results, the quality of the thin film can be assured.

Depending on the film growth conditions, monitor items and gas analysis items which are not necessary for quality assurance can be omitted.

For example, once the amount and composition of the supply gas, the temperature of the substrate, the growth pressure, the number of rotations of the substrate, and the gas flow rate are set, they do not largely deviate from the reference values. Thus, by analyzing only the amount and composition of the exhaust gas, the evaluation of the thin film can be simplified. When the thin film growth apparatus does not have a mechanism which rotates a substrate, it is not necessary to monitor the number of rotations of the substrate.

Moreover, the determination of whether or not a thin film is allowable can be manually performed by reading the record of the measured results.

As described above, according to this embodiment, a thin film formed on a substrate can be easily evaluated without an evaluation of the thin film itself. In addition, the thin film can be non-contractually, quickly and cheaply evaluated.

Fourth Embodiment

Figure 6:
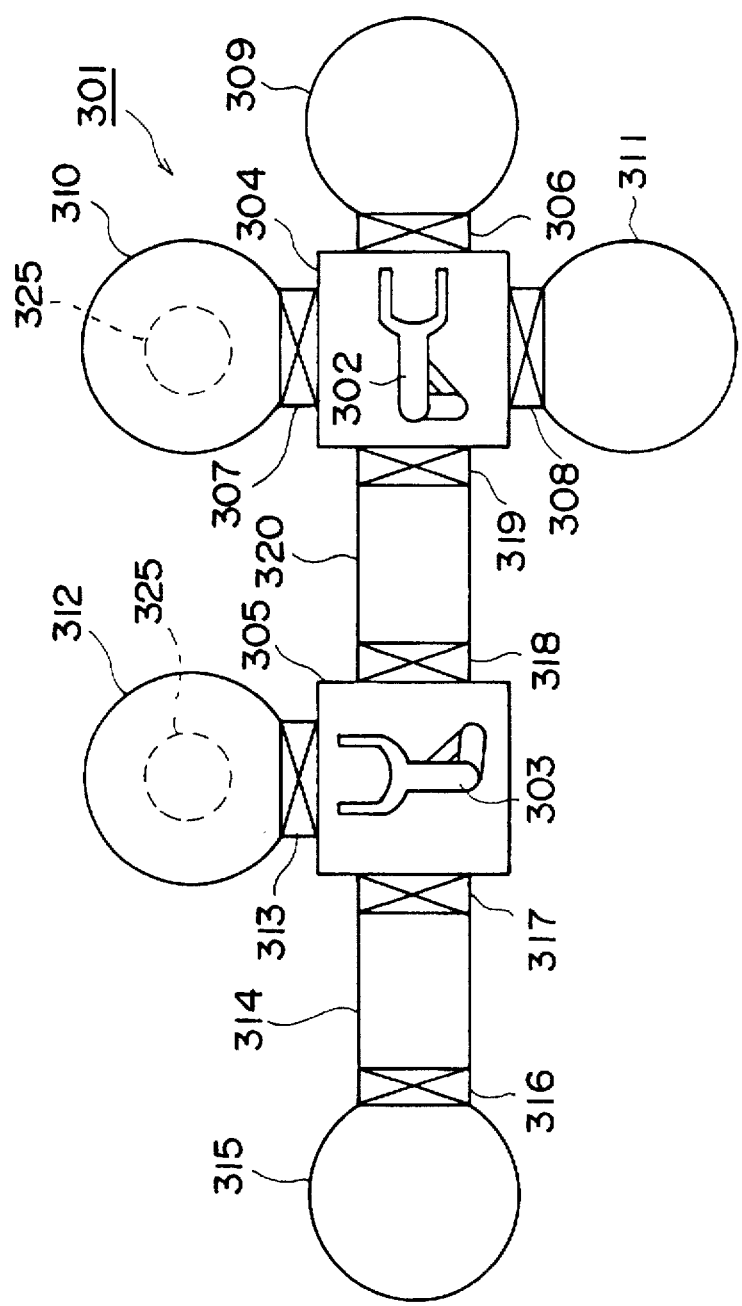
FIG. 6 is a schematic diagram showing the basic construction of a fourth embodiment according to the present invention.
Figure 8:
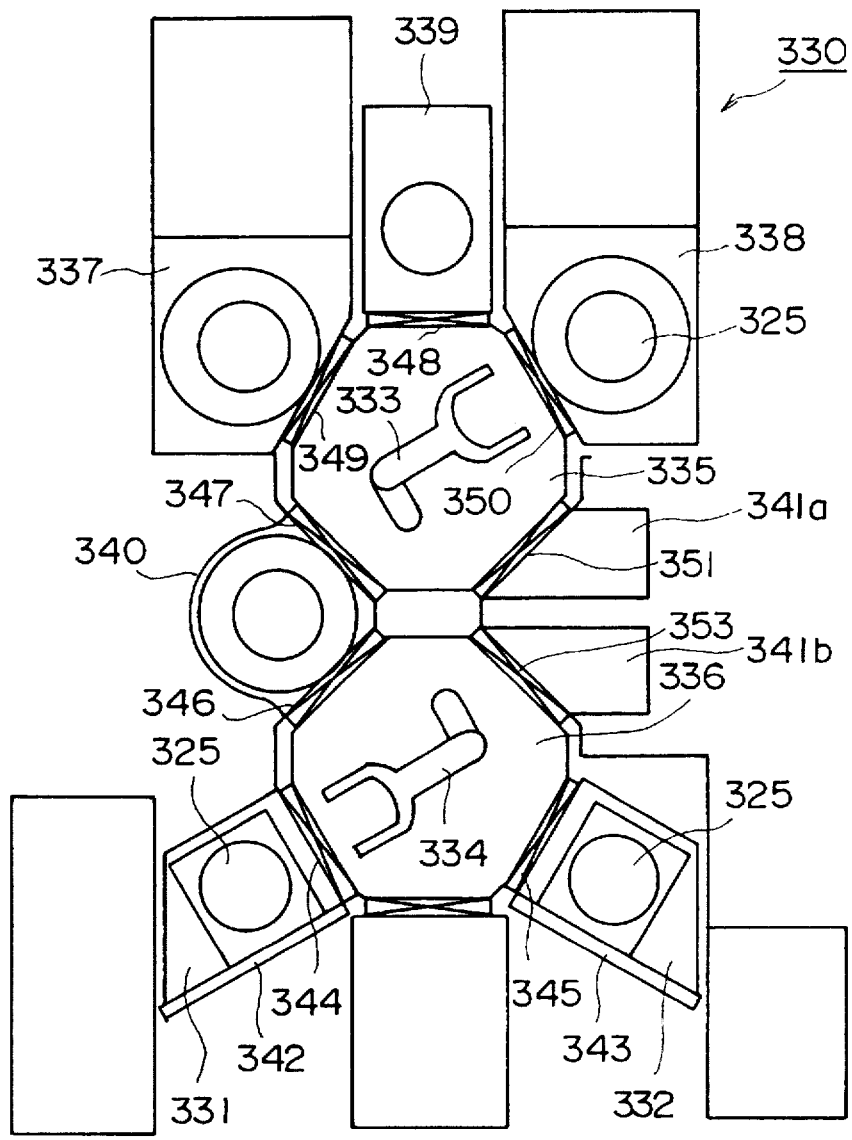
FIG. 8 is a schematic diagram showing another modification of the fourth embodiment.

FIGS. 6 to 8 are schematic diagrams showing a thin film growth apparatus according to a fourth embodiment of the present invention, FIG. 6 showing the basic construction thereof. In FIG. 6, reference numeral 301 is the thin film growth apparatus. The thin film growth apparatus 301 comprises two handler chambers which are first and second handler chambers 304 and 305. The first handler chamber 304 has a handler 302. The second handler chamber 305 has a handler 303. The first handler chamber 304 is connected to three process chambers 309, 310, and 311 through gate valves 306, 307, and 308. On the other hand, the second handler chamber 305 is connected to a process chamber 312 through a gate valve 313.

The second handler chamber 305 is connected to a cassette station 315 through a load lock chamber 314 which has a load lock mechanism. The load lock chamber 314 and the cassette station 315 are connected through a gate valve 316. The load lock chamber 314 and the second handler chamber 305 are connected through a gate valve 317.

The first handler chamber 304 and the second handler chamber 305 are connected through a gate valve 318, a connection chamber (load lock chamber) 320, and a gate valve 319 which are disposed in this order. The connection chamber 320 has a load lock mechanism. The atmospheres of the first and second handler chambers 304 and 305 are separated from each other by the connection chamber 320. The atmosphere in the first handler chamber 304 is vacuum or air at a reduced pressure which is used in the normal sequence. On the other hand, the atmosphere in the second handler chamber 305 is air at the atmospheric pressure. The load lock mechanism changes the atmosphere in each chamber to air at atmospheric pressure or vacuum.

In FIG. 6, the process chambers 309 to 311 connected to the first handler chamber 304 perform predetermined processes or inspections for a substrate under vacuum or reduced air pressure. The process chamber 312 connected to the second handler chamber 304 performs a predetermined process or inspection under atmospheric pressure.

Practically, the process chamber 309 is a thin film forming chamber which forms a thin film such as a silicon epitaxial film on the surface of a substrate 325 according to reduced pressure vapor phase epitaxial growth method. The process chamber 310 is an oxide film removal chamber which etches a natural oxide film adhered on the surface of the substrate with for example a HF (hydrogen fluoride) gas under reduced pressure so as to remove it. The process chamber 311 is a clean chamber which removes a reaction product which was adhered on the surface of the substrate 325 in the oxide film removing process. The process chamber 312 removes under atmospheric pressure a protection film which has been formed on the surface of the substrate 325 in the preceding process. In addition, the process chamber 312 forms a protection film on the surface of the substrate 325 on which a thin film was formed.

Substrates 325 which were pre-processed and held in a cassette or the like are transferred from a clean room (not shown in the figure). The substrates 325 are set in the cassette station 315. Next, the substrates 325 are transferred sheet by sheet to the load lock chamber 314 by the handler 303 which operates in an interlocking relationship with the open and close operations of the gate valve 316. Then, the gate valve 316 is closed and the atmosphere in the load lock chamber 314 is substituted with that of the second handler chamber 305.

Next, the substrate 325 in the load lock chamber 314 is transferred to the process chamber 312 through the handler chamber 305 by the handler 303 disposed therein, the handler 303 operating in an interlocking relationship with the open and close operations of the gate valves 317 and 313. When the substrate 325 is loaded in the process chamber 312, it removes the protection film formed on the surface of the substrate 325.

Then, the substrate 325 is transferred from the process chamber 312 to the connection chamber 320 by the handler 303 which operates in an interlocking relationship with the open and close operations of the gate valves 313 and 318. Thereafter, the gate valve 318 is closed and the atmosphere in the connection chamber 320 is substituted with air at reduced pressure or vacuum. Next, the substrate 325 is transferred from the connection chamber 320 to the process chamber (oxide film remove chamber) 310 by the handler 302 disposed in the first handler chamber 304, the handler operating in an interlocking relationship with the open and close operations of the gate valves 319 and 307. The process chamber 310 performs a pre-process which etches a natural oxide substance adhered on the surface of the substrate 325 with for example a HF (hydrogen fluoride) gas.

Next, the substrate 325 is transferred from the process chamber 310 to the process chamber (cleaning chamber) 311 by the handler 302 disposed in the first handler chamber 304, the handler 302 operating in an interlocking relationship with the open and close operations of the gate valves 307 and 306. The process chamber 311 removes a reaction product such as F (fluorine) adhered on the surface of the substrate 325.

Thereafter, the substrate 325 is transferred from the process chamber 311 to the process chamber (thin film forming chamber) 309 by the handler 302 which operates in an interlocking relationship with the open and close operations of the gate valves 308 and 306. The process chamber 309 supplies a prescribed gas and performs a described thin film growth process so as to form a thin film on the surface of the substrate 325.

Next, the substrate 325 is transferred from the process chamber 309 to the connection chamber 320 by the handler 302 disposed in the first handler chamber 304, the handler 302 operating in an interlocking relationship with the open and close operations of the gate valves 316 and 319. The connection chamber 320 closes the gate valve 319 and the atmosphere therein is substituted with atmospheric air. Then, the substrate is transferred from the connection chamber 320 to the process chamber 312 by the handler 303 of the first handler chamber 305, the handler 303 operating in an interlocking relationship with the open and close operations of the gate valves 318 and 313. The process chamber 313 forms a protection film on the surface of the substrate 325. Thereafter, the substrate 325 is transferred from the process chamber 313 to the cassette station 315 through the load lock chamber 314 in the reverse sequence. Then, the substrate 325 is held in a cassette disposed in the cassette station 314. Thus, the process sequence is completed.

When the connection chamber 320 removes a natural oxide film from the surface of the substrate 325, the oxide film removal chamber (process chamber) 310 can be omitted. In addition, when the first handler chamber 304 removes a reaction product which was adhered due to the removal of a natural oxide film, the process chamber (clean chamber) 311 can be omitted. Moreover, when the process chamber (clean chamber) 310 connected to the first handler chamber 304, the connection chamber 320, or the first handler chamber 304 removes the protection film formed in the preceding process, the process chamber 312 can form only the protection film which protects the thin film formed on the substrate 325.

FIG. 7 is a schematic diagram showing a modification of the fourth embodiment. In the figure, reference numeral 330 is a thin film growth apparatus 330. The apparatus 330 comprises two load/unload chambers 331 and 332, two handler chambers 335 and 336, and five process chambers 337 to 341. The first handler chamber 335 has a handler 333. The second handler chamber 336 has a handler 334. The process chambers 337 to 341 are connected to each of the handler chambers 335 and 336. Two process chambers 340 and 341 are connected to both the handler chambers 335 and 336, each of which is a connection chamber having a load lock mechanism.

The two load/unload chambers 331 and 332 can have a load lock mechanism.

Substrates 325 which were pre-processed and held in cassettes or the like are transferred from for example a clean room (not shown in the figure) and set in the chambers 331 and 332 through doors 322 and 343 thereof. Next, the atmospheres of the load/unload chambers 331 and 332 are substituted with that of the second handler chamber 336.

The substrates 325 set in the first and second load/unload chambers 331 and 332 are transferred sheet by sheet to the second handler chamber 336 by a handler 334 disposed therein, the handler 334 operating in an interlocking relationship with the open and close operations of gate valves 344 and 345. Next, a substrate 325 is transferred from the second handler chamber 336 to the connection chamber (process chamber) 340 by the handler 334 which operates in an interlocking relationship with the open and close operations of a gate valve 346. The connection chamber 340 is an oxide film removal chamber which performs a pre-process for the substrate 325 so as to remove a natural oxide film therefrom. When the substrate 325 is loaded in the connection chamber 340, it performs a pre-process which etches a natural oxide substance adhering to the surface of the substrate 325 with for example a HF (hydrogen fluoride) gas.

Next, the substrate 325 is transferred from the connection chamber 340 to the first handler chamber 335 by a handler 333 disposed therein, the handler 333 operating in an interlocking relationship with the open and close operations of a gate valve 347. Then, the substrate 325 in the first handler chamber 335 is transferred to the process chamber (orientation flat alignment chamber) 339 by the handler 333 which operates in an interlocking relationship with the open and close operations of a gate valve 348.

The process chamber (orientation flat alignment chamber) 339 detects the position of the orientation flat disposed on the substrate 325 and aligns the position of the substrate 325 in a prescribed direction. When the orientation flat alignment process is not necessary or another orientation flat alignment process is used, the process chamber 339 can be omitted. In addition, the process chamber 339 can obtain the thickness of an epitaxial growth thin film by measuring the thickness of the substrate 325 before and after the thin film is grown.

Thereafter, the substrate 325 is transferred from the process chamber 339 to the first or second process chamber (first or second thin film growth chamber) 337 or 338 by the handler 333 which operates in an interlocking relationship with the open and close operations of a gate valve 349 or 350, respectively. When a HF gas was used in the etching process (pre-process), the process chamber (thin film growth chamber) 337 or 338 radiates ultraviolet rays to the surface of the substrate 325 so as to remove the F (fluorine) therefrom. Thereafter, the process chamber 337 or 338 performs a thin film growth process while supplying prescribed gases so as to form a thin film on the surface of the substrate 325.

After the thin film growth process is completed, the substrate 325 is transferred from the first or second process chamber 337 or 338 to the first handler chamber 335 by the handler 333 which operates in an interlocking relationship with the open and close operations of a gate valve 349 or 350, respectively. The substrate 325 in the handler chamber 335 is transferred to the process chamber 340 by the handler 333 which operates in an interlocking relationship with the open and close operations of a gate valve 347. Thereafter, the substrate 325 is transferred from the second handler chamber 336 to the inspection chamber 341 by the handler 334 which operates in an interlocking relationship with the open and close operations of gate valves 346 and 353. The inspection chamber 341 is provided with a measurement unit 352.

The inspection chamber 341 performs various measurements and inspections for the thin film formed on the substrate 325.

After these inspections are completed, the substrate 325 is transferred from the inspection chamber 341 to the second handler chamber 336 by the handler 334 which operates in an interlocking relationship with the open and close operations of a gate valve 353. Thereafter, the substrate 325 in the handler chamber 336 is held in a cassette disposed in the first or second load/unload chamber 331 or 332 by the handler 334. Thus, the process sequence is completed.

The substrate pre-process chamber 340 is provided with a load lock mechanism which changes the atmosphere in the chamber 340 to air atmosphere or vacuum atmosphere. The volume of the substrate pre-process chamber 340 is less than that of each of other chambers 331, 332, 335, 336, 337, 338, 339, and 341. Thus, the deaerating process or air atmosphere restoring process can be easily performed.

Next, with reference to FIG. 8, another modification of the fourth embodiment will be described. As shown in the figure, in this modification, instead of a single large inspection chamber 341, first and second small inspection chambers 341a and 341b are connected to both first and second handler chambers 335 and 336. Other parts of the modification shown in FIG. 8 are nearly the same as those shown in FIG. 7. In this modification, as shown in FIG. 8, a gate valve 351 is disposed between the first handler chamber 335 and the first inspection chamber 341a. In addition, a gate valve 353 is disposed between the second handler chamber 336 and the second inspection chamber 341b.

As described above, according to this embodiment, it is not necessary to change the atmospheres in all of a plurality of handler chambers to vacuum. In addition, since the atmosphere in each process chamber connected to handler chambers is suitably changed, the scope of the application of the multi-chamber type substrate processing apparatus can be widened.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing apparatus, comprising:

a process chamber for performing a prescribed process with respect to a substrate;

an inspection chamber, connected to said process chamber, for performing a prescribed analysis with respect to said substrate;

a transfer assembly to load and unload said substrate between said process chamber and said inspection chamber;

an analytic information storage memory to store analytic information of said substrate received from said inspection chamber; and an analytic information analyzer which retrieves said analytic information from said analytic information storage memory and analyzes said analytic information while said substrate is transferred to the outside of said inspection chamber by said transfer assembly or after said substrate is transferred to the outside of said inspection chamber by said transfer assembly, wherein at least one of said process chamber and said inspection chamber includes a load lock chamber having a volume less than volumes of the other chambers for changing the atmosphere in said process chamber or inspection chamber into the atmospheric air atmosphere or a vacuum atmosphere.

2. The substrate processing apparatus as set forth in claim 1, further comprising:

a closing assembly, disposed between said process chamber and said inspection chamber, for air-tightly closing said process chamber and said inspection chamber.

3. The substrate processing apparatus as set forth in claim 2, wherein said closing assembly is adapted to operate in an interlocking relationship with said transfer assembly.

4. The substrate processing apparatus as set forth in claim 1, wherein said transfer assembly is disposed in a transfer chamber disposed adjacent to said process chamber and said inspection chamber.

5. The substrate processing apparatus as set forth in claim 1, wherein said analytic information analyzer is adapted to analyze said analytic information while or after said substrate is processed in said process chamber.

6. The substrate processing apparatus as set forth in claim 1, wherein said process chamber is a thin film growth chamber for forming a thin film on the surface of said substrate, said thin film growth chamber having a gas supply unit and a gas exhaust unit, wherein said substrate processing apparatus further comprises an exhaust gas analyzing unit connected to said gas exhaust unit, for analyzing the amount, the composition, or both the amount and composition of an exhaust gas; and a reference memory;

a record/analysis/determination unit to set the amount, the composition, or both the amount and composition of supply gas supplied to said thin film growth chamber and process conditions of said thin film growth chamber;

wherein said record/analysis/determination unit evaluates a thin film of said substrate according to an exhaust gas analysis result received from said exhaust gas analyzing unit by comparing the exhaust gas analysis result with reference information which has been stored in said reference memory.

7. The substrate processing apparatus as set forth in claim 6, further comprising:

a supply gas analyzing unit connected to said gas supply unit, for analyzing the amount and composition of said supply gas, wherein said thin film growth chamber includes a pressure gauge and a thermometer for measuring the pressure and temperature therein, wherein said supply gas analyzing unit, said pressure gauge, and said thermometer are connected to said record/analysis/determination unit, and wherein said record/analysis/determination unit evaluates a thin film of said substrate according to results of analysis of said supply gas and said exhaust gas and measurement results of said pressure gauge and said thermometer by comparing the results of analysis of the supply gas and the measurement results of the pressure gauge and the thermometer with reference information which has been stored in said reference memory.

8. The substrate processing apparatus as set forth in claim 7, wherein said thin film growth chamber includes a substrate holder and a rotation meter, said holder for holding said substrate, said rotation meter for measuring rotational speed of said substrate holder, wherein said rotation meter is connected to said record/analysis/determination unit, and wherein said record/analysis/determination unit evaluates a thin film of said substrate according to analytic results of said supply gas and said exhaust gas, the pressure and temperature in said thin film growth chamber, and the rotational speed of said substrate holder by comparing the rotational speed with reference information which has been stored in said reference memory.

9. The substrate processing apparatus as set forth in claim 1, wherein said transfer assembly is disposed in a plurality of transfer chambers, each of which is arranged adjacent to said process chamber and said inspection chamber, and wherein a load lock chamber having a load lock mechanism is disposed between said transfer chambers, said load lock mechanism being adapted to change the atmosphere in said load lock chamber into the atmospheric air atmosphere or a vacuum atmosphere.

10. The substrate processing apparatus as set forth in claim 9, wherein said load lock chamber has process function means with respect to said substrate.

11. The substrate processing apparatus as set forth in claim 9, wherein a volume of said load lock chamber is less than volumes of the other chambers.

12. A substrate processing apparatus, comprising:

a process chamber for performing a prescribed process with respect to a substrate;

an inspection chamber, connected to said process chamber, for performing prescribed analyses with respect to said substrate before and after performing the prescribed process;

a transfer assembly to load and unload said substrate between said process chamber and said inspection chamber; and a controller which controls the process chamber, the inspection chamber and the transfer assembly and calculates properties of the substrate in accordance with analysis results from the inspection chamber with respect to the substrate before and after performing the prescribed process.

13. The substrate processing apparatus as set forth in claim 12, wherein the process chamber performs a process with respect to the substrate;

the inspection chamber performs thickness measurements with respect to the substrate before and after performing the process; and the control unit calculates the thickness difference of the substrate in accordance with the results of the thickness measurements from the inspection chamber.

* * * * *